United States Patent
Gorczyca et al.

(10) Patent No.: US 8,431,444 B2
(45) Date of Patent: Apr. 30, 2013

(54) EPOXY ENCAPSULATING AND LAMINATION ADHESIVE AND METHOD OF MAKING SAME

(75) Inventors: Thomas Bert Gorczyca, Schenectady, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 16 days.

(21) Appl. No.: 13/210,763

(22) Filed: Aug. 16, 2011

(65) Prior Publication Data

US 2013/0045575 A1  Feb. 21, 2013

(51) Int. Cl.
*H01L 21/02* (2006.01)
*C08K 5/1535* (2006.01)
*C08J 7/18* (2006.01)
*B05D 3/02* (2006.01)

(52) U.S. Cl.
USPC ............ 438/118; 524/109; 427/555; 427/386

(58) Field of Classification Search .................. 524/109; 427/386, 555; 438/118
See application file for complete search history.

(56) References Cited

U.S. PATENT DOCUMENTS

| | | | | |
|---|---|---|---|---|
| 4,554,342 A | * | 11/1985 | Corley | 528/90 |
| 4,916,202 A | * | 4/1990 | Butler et al. | 528/98 |
| 6,232,151 B1 | | 5/2001 | Ozmat et al. | |
| 6,242,282 B1 | | 6/2001 | Fillion et al. | |
| 6,396,153 B2 | | 5/2002 | Fillion et al. | |
| 6,459,561 B1 | | 10/2002 | Galvagni et al. | |
| 6,737,002 B1 | | 5/2004 | Rose et al. | |
| 7,710,233 B2 | | 5/2010 | Feichtinger et al. | |
| 7,964,974 B2 | | 6/2011 | Fillion et al. | |
| 2007/0293603 A1 | * | 12/2007 | Shepherd et al. | 523/467 |
| 2010/0078797 A1 | | 4/2010 | McConnelee et al. | |
| 2010/0132994 A1 | | 6/2010 | Fillion et al. | |
| 2010/0133705 A1 | | 6/2010 | Fillion et al. | |
| 2010/0224992 A1 | | 9/2010 | McConnelee et al. | |

FOREIGN PATENT DOCUMENTS

WO  WO 2008089410  *  7/2008

* cited by examiner

*Primary Examiner* — John Uselding
(74) *Attorney, Agent, or Firm* — Ziolkowski Patent Solutions Group, SC; Jean K. Testa

(57) ABSTRACT

An adhesive includes an epoxy resin and a hardener. The hardener includes trioxdiamine, diaminodicyclohexyl-methane, toluene diamine, and bisphenol-A dianhydride.

20 Claims, 9 Drawing Sheets

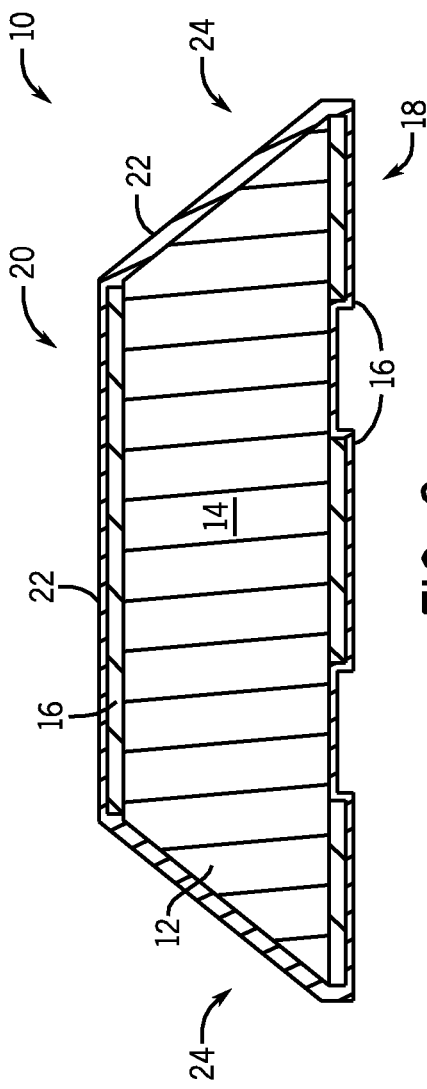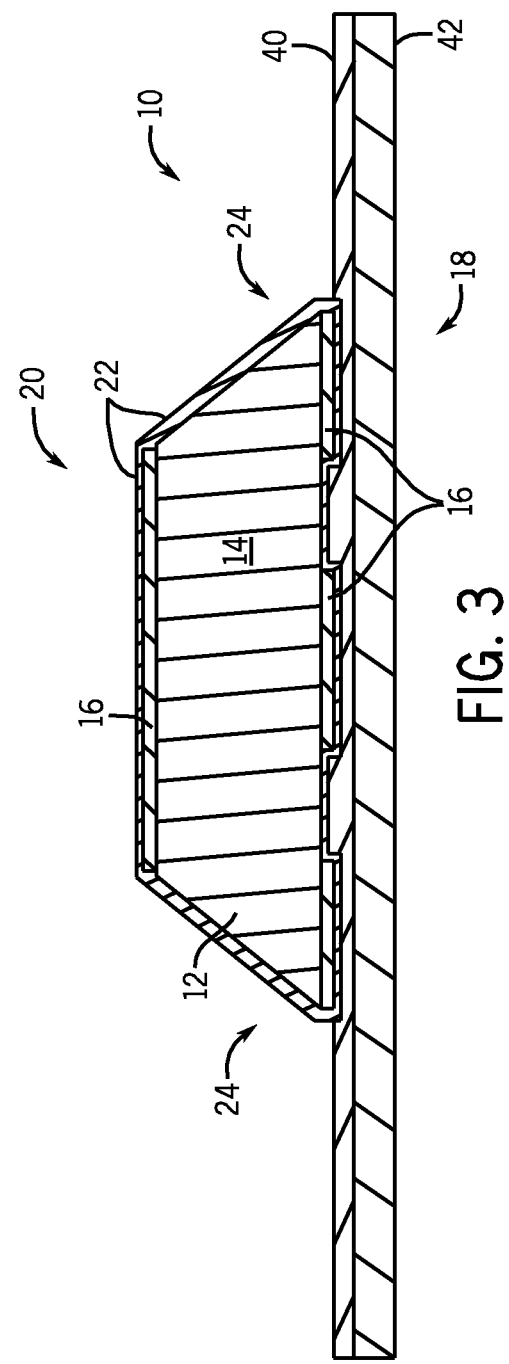

EPOXY ENCAPSULATING AND LAMINATION ADHESIVE AND METHOD OF MAKING SAME

BACKGROUND OF THE INVENTION

Embodiments of the invention relate generally to structures and methods for packaging semiconductor devices and, more particularly, to a semiconductor device package adhesive that provides stable high voltage electrical operation.

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging (CSP). Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

Some semiconductor devices and packages include high voltage power semiconductor devices that are used as switches or rectifiers in power electronic circuits, such as switched mode power supplies, for example. Most power semiconductor devices are only used in commutation mode (i.e., they are either on or off), and are therefore optimized for this. Many power semiconductor devices are used in high voltage power applications and are designed to carry a large amount of current and support a large voltage.

In use, some high voltage power semiconductor devices are connected to an external circuit by way of a power overlay (POL) packaging and interconnect system, with the POL package also providing a way to remove the heat generated by the device and protect the device from the external environment. A standard POL manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s). The metal interconnects may be in the form of a low profile (e.g., less than 200 micrometers thick), planar interconnect structure that provides for formation of an input/output (I/O) system to and from the power semiconductor device(s).

Inherent to some packaging technologies is the use of high-voltage switches or assemblies typically having a length of five centimeters or more. Typically such switches include a trapezoidal cross-section or profile that is affixed to a base or supporting material such as kapton, then electrically connected to other components within an assembly. The trapezoidal cross-section includes a pair of parallel surfaces, and a pair of non-parallel surfaces that are opposite one another. Typically, one of the parallel surfaces includes a surface of switches that is adhered to, for instance, the kapton, and the other of the parallel surfaces includes a ground or power plane.

In order to avoid warpage and protect the high-voltage assembly from external influences, an encapsulant is often applied, which is then laser ablated in order to electrically connect to the ground or power plane. However, because of thermal effects, water absorption, and the like, such an assembly is prone to warpage. Further, because the encapsulant also typically includes voids or may be applied either too thinly or too thickly, corona discharge and sparking can occur during high-voltage operation, which can lead to performance degradation and early life failure.

And, with respect to providing dielectric isolation between the anode and cathode junctions, a high dielectric material that is capable of providing a high reverse breakdown voltage (e.g., up to 10 kV) is typically provided for the semiconductor diode. However, such dielectric materials often have an increased thickness that may be incompatible with certain POL packaging techniques for the semiconductor diode and, if the thickness is not properly controlled, can lead to increased parasitic inductance.

Accordingly, there is a need for a simplified method for encapsulating high-voltage switches and assemblies, and for an improved adhesive.

BRIEF DESCRIPTION OF THE INVENTION

The invention is an epoxy encapsulating and lamination adhesive and method of making same.

In accordance with one aspect of the invention, an adhesive includes an epoxy resin and a hardener. The hardener includes trioxdiamine, diaminodicyclohexylmethane, toluene diamine, and bisphenol-A dianhydride.

In accordance with another aspect of the invention, a method of preparing an adhesive includes mixing together a plurality of reactants to form a hardener, the reactants comprising trioxdiamine, diaminodicyclohexylmethane, toluene diamine, and bisphenol-A dianhydride, mixing the hardener with an epoxy resin to form an uncured adhesive mixture, and curing the uncured adhesive mixture.

In accordance with yet another aspect of the invention, a method of forming a semiconductor device package includes positioning a semiconductor device against a material to form a space between a surface of the semiconductor device and the material, mixing together a plurality of reactants to form a hardener, the reactants comprising trioxdiamine, diaminodicyclohexylmethane, toluene diamine, and bisphenol-A dianhydride, mixing the hardener with an epoxy resin to form an uncured adhesive mixture, placing the uncured adhesive mixture into the space, and curing the uncured adhesive mixture.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings:

FIGS. 2-13 are schematic cross-sectional side views of a semiconductor device package during various stages of a manufacturing/build-up process that can benefit from embodiments of the invention.

DETAILED DESCRIPTION

Embodiments of the invention provide for an adhesive/encapsulant for a semiconductor device package having a high breakdown voltage and low parasitic inductance, as well as a method of forming such a semiconductor device package.

The formulation for the adhesive/encapsulant meets certain requirements that include but are not limited to low viscosity, ability to partial cure, low surface tension, low stress, working life, gelling at room temperature, ability to laser ablate at a desired laser wavelength, ability to obtain and control a desired glass transition temperature, and good dielectric properties. The semiconductor device package is manufactured such that edges of the semiconductor device are passivated using multiple dielectric layers of differing thickness, with an electrical interconnect system being formed to top and bottom surfaces of the semiconductor device.

Figure 1:
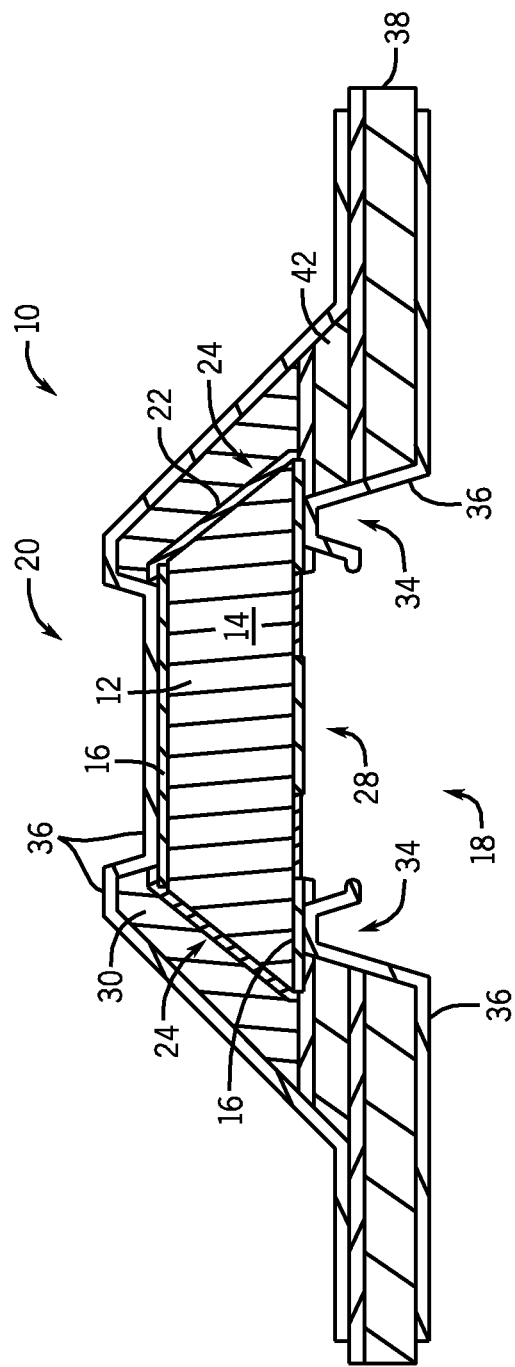
FIG. 1 is a schematic cross-sectional side view of a semiconductor device package using an adhesive/encapsulant that is formulated and prepared according to an embodiment of the invention.

Referring to FIG. 1, a semiconductor device package 10 is shown that incorporates an exemplary embodiment of the invention. The semiconductor device package 10 includes a semiconductor device 12 therein that may be in the form of a die, diode, or other electronic device. Semiconductor device 12 is in the form of a high voltage semiconductor diode, such as an optical diode having a back bias in the reverse direction, for example. As shown in FIG. 1, semiconductor device 12 may have a trapezoidal shape, however, it is recognized that other shapes and configurations for semiconductor device 12 are envisioned, such as a rectangular shape, for example. Furthermore, regarding the shape and size of semiconductor device 12, it is recognized that semiconductor device 12 is in the form of a "thicker" device, with semiconductor device 12 having a thickness/height of up to 40 mm or more, for example.

The semiconductor device 12 includes a substrate 14 formed of a semiconductor material such as silicon, silicon carbine, gallium nitride, gallium arsenide, or another semiconductor material, that has impurities added to it to create a region on one side that contains negative charge carriers (electrons), called n-type semiconductor, and a region on the other side that contains positive charge carriers (holes), called p-type semiconductor. The boundary within the substrate between these two regions, called a PN junction, is where the action of the diode takes place, with the substrate conducting conventional current in a direction from the p-type side (i.e., the anode) to the n-type side (i.e., the cathode), but not in the opposite direction. Semiconductor device 12 is termed as a "high voltage" device in that it will typically be operated at a voltage of 3 kV or greater, with voltages above 10 kV being envisioned.

Formed on the substrate, and attached to each of the P and N regions, is a plurality of metalized circuits and/or connection pads (i.e., terminals) 16 through which an electrical connection can be made to semiconductor device 12. As shown in FIG. 1, the circuits/connection pads 16 are formed on surfaces 18, 20 of substrate, such that electrical connections can be made with two surfaces of semiconductor device 12.

Also included in semiconductor device package 10 is a first passivation or dielectric layer 22 that is formed about surfaces 18, 20 and the edges 24 of the semiconductor device 12, so as to cover substrate 14 and metalized circuits/connection pads 16. First passivation layer 22 is in the form of a high performance film, such as silicon nitride, silicon oxide, or another suitable dielectric material that may include an adhesive that is formed according to an embodiment of the invention, that is applied onto semiconductor device 12 so as to have a uniform thickness. According to one embodiment of the invention, the first passivation layer 22 is applied using plasma enhanced chemical vapor deposition (PECVD) so as to have a thickness in the order of 1-2 microns. The first passivation layer 22 thus serves to passivate the edges 24 of semiconductor device 12 as well as protect the surfaces of substrate 14 and metalized circuits/connection pads 16, such as during manufacturing processing steps of the semiconductor device package 10 (e.g., etching, lamination, etc.), as explained in detail below.

As shown in FIG. 1, portions of first passivation layer 22 are removed in locations adjacent metal circuits/connection pads 16 of semiconductor device 12, such as by using reactive ion etching (RIE), so as to provide for an electrical interconnection to made to those circuits/connection pads 16. According to an embodiment of the invention, where semiconductor device package 10 is in the form of an optically active device, first passivation layer 22 is optically clear, so as to permit light to pass there through while still offering protection of an optical window 28 of the semiconductor device package 10. However, it is recognized that semiconductor device 12 may be in the form of a device/diode that is not an optically active device, and thus illustrated embodiments may not include an optical window 28, nor require use of an optically clear passivation layer.

While the first passivation layer 22 serves to passivate the edges 24 of semiconductor device 12 and provide a protective covering for the metal circuits/connection pads 16 formed thereon, it is recognized that the thinness of the first passivation layer 22 (i.e., the coating of silicon nitride/oxide) may, nevertheless, be insufficient to hold very large voltages. As such, semiconductor device package 10 may also include a second passivation or dielectric layer 30 that is applied on top of the first passivation layer 22 and that extends out over the edges 24 of semiconductor device 12, with an adhesive layer (not shown) being optionally included there between depending on the form of the second passivation layer 30. As shown in FIG. 1, the second passivation layer 30 is applied as a thicker layer or coating of dielectric material as compared to first passivation layer 22, so as to provide a higher dielectric strength and increase the breakdown voltage of semiconductor device package 10. The thickness of second passivation layer 30 may be up to 1-2 mm, according to one embodiment of the invention, and may also be formed of an adhesive that is formed according to embodiments of the invention.

Since the nitrides and oxides used for forming first passivation layer 22 often cannot be applied much thicker than a few microns, second passivation layer 30 may be formed of the same material or a different material than first passivation layer 22, i.e. one that provides good compatibility (i.e., adhesion) to the already applied nitride/oxide film of the first passivation layer 22. Second passivation layer 30 may thus be formed of such materials as polyimides, epoxies, paralyene, silicones, etc. Second passivation layer 30 may be in the form of a pre-formed laminate sheet or film that is formed of Kapton®, Ultem®, polytetrafluoroethylene (PTFE), Upilex®, polysulfone materials (e.g., Udel®, Radel®), or another polymer film, such as a liquid crystal polymer (LCP) or a polyimide material. According to an embodiment of the invention, second passivation layer 30 is formed using an epoxy resin that is cured using an amine-imide hardener that is described below in FIG. 14. Alternatively, second passivation layer 30 can be in liquid form and applied via one of a spray coating application, a molding process, or a selective deposition process (i.e., "direct writing"), as will be explained in detail below. Whether second passivation layer 30 is formed of dielectric material applied in laminate form, liquid form, or a combination thereof, the second passivation layer 30 is applied over the edges 24 of the semiconductor device 12 in a controlled manner such that the thickness thereof is sufficient for a desired/required dielectric strength but yet does not excessively increase the inductive loop of the semiconductor device 12. A typical thickness of second passivation layer 30 is thus, for example, in the range of around 10-50 microns for every 1000 volts of dielectric breakdown strength needed.

Thus, first passivation layer 22 may include nitrides, oxides, or other known dielectrics to provide an improved dielectric strength, and may be formed of an adhesive/encapsulant that is formed according to embodiments of the invention. Second passivation layer 30 may be formed of the same material. As such, according to the invention, either or both layers 22, 30 may be formed of an adhesive/encapsulant that is formed according to embodiments of the invention.

As further shown in FIG. 1, according to one embodiment of the invention, a base dielectric layer 42 is applied to surface 18 of semiconductor device 12, such that a thicker dielectric layer is formed entirely about the semiconductor device (i.e., combination of second passivation layer 30 and layer 42 is formed about semiconductor device 12). According to one embodiment, dielectric layer 42 is formed of an adhesive/encapsulant that is formed according to embodiments of the invention. Each of the first and second passivation layers 22, 30, as well as the base dielectric laminate and an additional laminate sheet of dielectric film 38 secured to base dielectric laminate 42, are selectively patterned to form a plurality of vias and/or openings 34 therein. The vias/openings 34 are formed at positions corresponding to the metalized circuits/connection pads 16 formed on semiconductor device 12, so as to expose the circuits/connection pads 16. According to one embodiment of the invention, the vias/openings 34 are formed through the first and second passivation layers 22, 30, base dielectric laminate 42, and dielectric film 38 by way of a laser ablation or laser drilling process that is performed subsequent to application of the layers 22, 30, base dielectric laminate 42, and dielectric film 38 onto semiconductor device 12. According to one embodiment of the invention, the laser ablation is performed using a laser having a 350 nm wavelength, and the adhesive used to form one or all of first and second passivation layers 22, 30 and base dielectric layer 42 is formulated having a tailored sensitivity to laser energy at particularly 350 nm wavelength. Alternatively, the vias/openings 34 may be pre-formed in second passivation layer 30 and/or dielectric laminates 42, 38 by way of a laser ablation or laser drilling process that is performed prior to application thereof onto first passivation layer 22, again using an adhesive having a tailored sensitivity to laser energy at particularly 350 nm wavelength. In an embodiment where the vias/openings 34 are pre-drilled through second passivation layer 30 and dielectric laminates 42, 38, a separate reactive ion etching (RIE) process may be performed to extend vias/openings 34 down through first passivation layer 22 to circuits/connection pads 16. According to additional embodiments of the invention, it is also recognized that vias/openings 34 may be formed by way of other methods, including plasma etching, photo-definition, or mechanical drilling processes.

Formed within each of vias/openings 34 is a metal interconnect 36 that extends down through vias/openings 34 to circuits/connection pads 16 on the semiconductor device 12. Metal interconnects 36 thus form direct metallic and electrical connections to circuits/connection pads 16, with the interconnects being formed in a tightly packed, close arrangement. Metal interconnects 36 are formed by way of applying a metal layer/material, such as via a sputtering or electroplating process, and then subsequently patterning the applied metal material into metal interconnects 36 having a desired shape. The metal interconnects 36 are formed by applying a titanium adhesion layer and copper seed layer via a sputtering process, followed by electroplating of additional copper thereon to increase a thickness of the metal interconnects 36.

As shown in FIG. 1, on surface 20 of semiconductor device 12, the copper plating of metal interconnects 36 extend out from circuits/connection pads 16 of semiconductor device 12, through vias/openings 34, and out across the outer surface of second passivation layer 30 out past the edges 24 of semiconductor device 12, with the interconnects 36 in the region extending out past the edges 24 of semiconductor device 12 being formed on the additional laminate sheet of dielectric film 38 secured to base dielectric laminate 42. On surface 18 of semiconductor device 12, the copper plating of metal interconnects 36 extend out from circuits/connection pads 16 of semiconductor device 12, through vias/openings 34 formed in base dielectric laminate 42 and dielectric film 38, and out across the outer surface of dielectric film 38, with the interconnects 36 extending out past the edges 24 of semiconductor device 12 on film 38 and on a side of film 38 opposite from the interconnects 36 formed on surface 20, so as to be electrically insulated therefrom.

Beneficially, the structure of semiconductor device package 10 results in a package having a high breakdown voltage and low inductance loop. That is, the arrangement of first and second passivation layers 22, 30 and interconnects 36 can provide for a high breakdown voltage of 10 kV, with the thickness thereof being controlled so as to also decrease parasitic inductance between the anode and cathode in the semiconductor device package 10. The structure of semiconductor device package 10 allows for operation thereof at an improved/efficient operating frequency, with reduced switching time and improved signal strength for subsequent signal transmission (e.g., generation of a square wave pulse for Fourier processing).

Referring to FIGS. 2-10, various process steps for techniques of manufacturing semiconductor device package 10 are set forth. As shown in FIG. 2, the build-up process of semiconductor device package 10 begins with application of a first passivation or dielectric layer 22 on semiconductor device 12. The first passivation layer 22 is formed about surfaces 18, 20 and edges 24 of the semiconductor device 12, so as to cover the substrate 14 and metalized circuits/connection pads 16 of the semiconductor device. First passivation layer 22 may be in the form of an adhesive that is formed according to embodiments of the invention, including embedded materials such as silicon nitride or silicon oxide, that is applied onto semiconductor device 12 so as to have a uniform thickness. According to one embodiment of the invention, first passivation layer 22 is applied using plasma enhanced chemical vapor deposition (PECVD) so as to have a thickness in the order of 1-2 microns. The first passivation layer 22 thus serves to passivate the edges 24 of semiconductor device 12 as well as protect the surfaces 18, 20 of substrate 14 and metalized circuits/connection pads 16.

Referring now to FIG. 3, in a next step of the build-up process, the semiconductor device 12, with the first passivation layer 22 applied thereto, is placed into an adhesive layer 40 and accompanying base dielectric layer 42 that is in the form of a lamination/film. As shown in FIG. 3, semiconductor device 12 is placed onto adhesive layer 40 and dielectric layer 42 such that surface 18 thereof is secured to the layers 40, 42, with the surface 20 of semiconductor device 12 remaining open. The dielectric layer 42 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material. According to an embodiment of the invention, dielectric layer 42 is formed using an epoxy resin that is cured using an amine-imide hardener that is described below in FIG. 14.

Upon placement of semiconductor device 12 onto adhesive layer 40 and base dielectric lamination 42, the adhesive 40 is cured to secure the semiconductor device 12 on the dielectric lamination 42.

The build-up process continues with application of another dielectric or passivation layer (i.e., second passivation layer) onto surface 20 and edges 24 of semiconductor device 12. As shown and described below in FIGS. 4-7, it is recognized that such a dielectric layer may be applied according to one of several application processes, such as by way of application of a pre-formed laminate sheet or film layer of dielectric material or by way of application of a liquid dielectric material via a spray coating application, a molding process, or a selective deposition process (i.e., "direct writing").

Figure 4A:
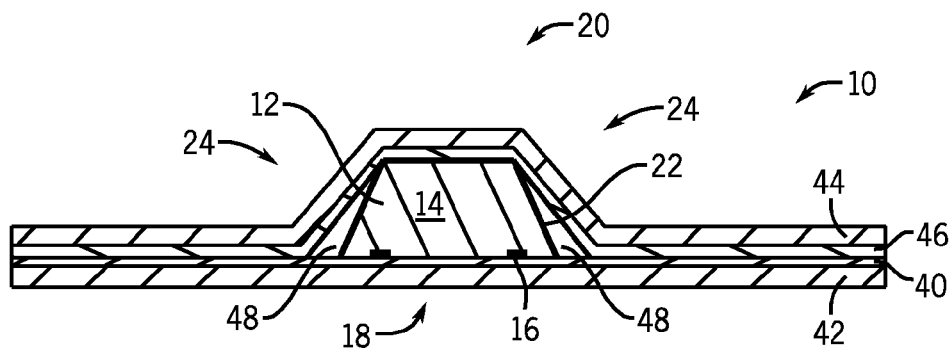
Figure 4B:
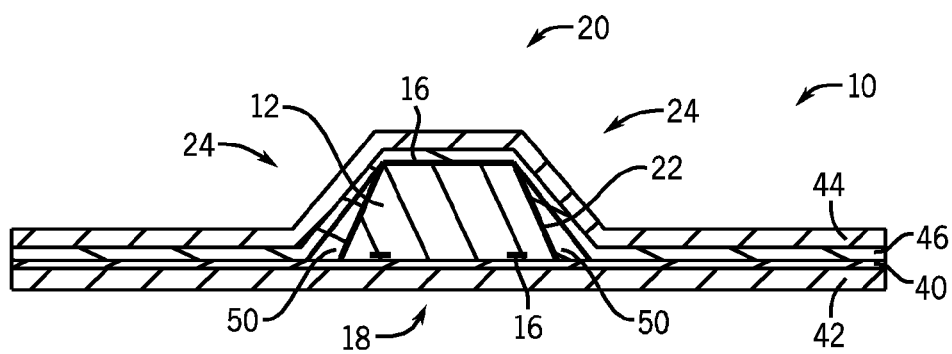
Figure 4C:
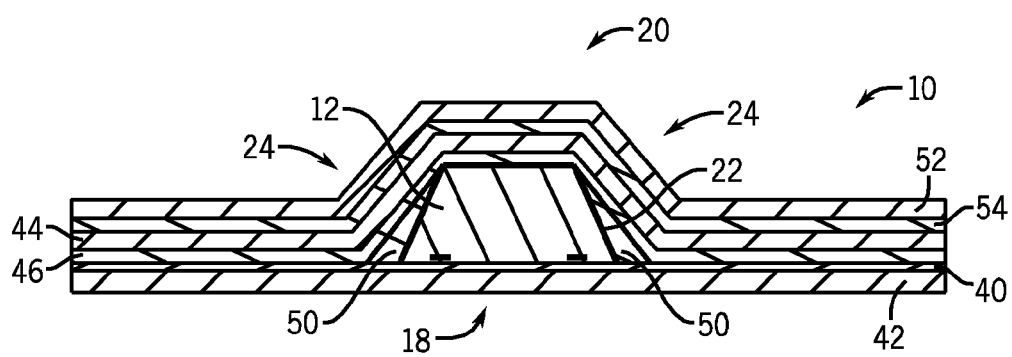

Referring to FIGS. 4A-4C, dielectric material 44 is applied over surface 20 and edges 24 of semiconductor device 12, with an adhesive layer 46 (e.g., B-staged, tacky adhesive) included therebetween to secure the sheet of dielectric material 44 to semiconductor device 12. As shown in FIG. 4A, the thickness of dielectric sheet 44 is greater than that of first passivation layer 22, with the thickness of dielectric sheet 44 being determined and controlled based on the dielectric breakdown strength needed for semiconductor device 12. In general, the thickness of dielectric sheet 44 will be in the range of around 10-50 microns for every 1 kV of dielectric breakdown strength needed. According to one embodiment, in lieu of dielectric sheet 44 and adhesive layer 46, an epoxy or encapsulant is provided that includes a composition and method of preparing that include embodiments of the invention.

As shown in FIG. 4A, when dielectric material 44 is applied over surface 20 and edges 24 of semiconductor device 12 in the form of a laminate sheet, a space or void 48 may be left adjacent the edges 24 of semiconductor device 12, which is termed "tenting." This void 48 is filled in a next step of the build-up process, as shown in FIG. 4B, with an epoxy or polyimide material 50 that is subsequently cured, wherein epoxy or polyimide material 50 is an epoxy or encapsulant that includes a composition and method of preparing that include embodiments of the invention. The void 48 is filled from one end with the epoxy/polyimide 50, with a vent hole (not shown) being provided at the other end to let out air. It is recognized that if no tenting is seen, then the step illustrated at FIG. 4B would not be needed.

Referring now to FIG. 4C, additional laminate sheets of dielectric material 52 may be applied over surface 20 and edges 24 of semiconductor device 12 depending on the electrical requirements of semiconductor device package 10 (i.e., to further increase the dielectric strength), or additional layers may be provided thereto (in lieu of material 52) using an epoxy or encapsulant that includes a composition and method of preparing that include embodiments of the invention. Thus, additional dielectric material 52 may be positioned on top of the dielectric sheet 44 (with an adhesive layer 54 in an embodiment wherein material 52 is a sheet) included therebetween to secure the sheets 44, 52 together. While not shown in FIG. 4C, yet still additional sheets or other dielectric materials may be added over surface 20 of semiconductor device 12 as needed.

Figure 5:
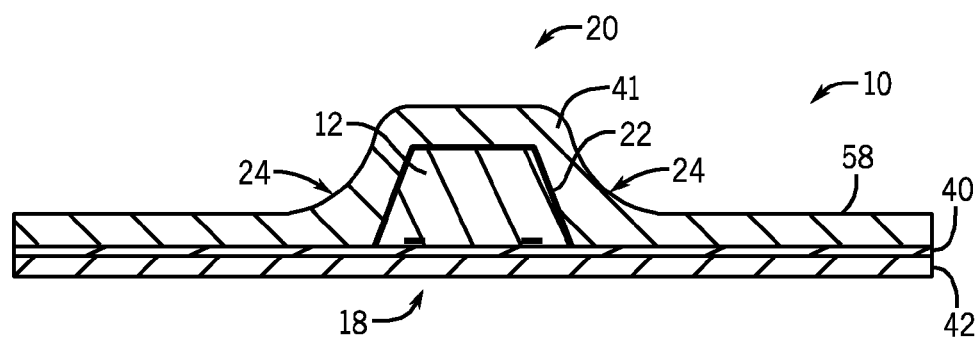

Referring now to FIG. 5, according to another embodiment of the invention, a liquid dielectric material 41 is applied over surface 20 and edges 24 of semiconductor device 12 via a spray coating application. The liquid dielectric material is formed, according to one embodiment, using an epoxy resin that is cured using an amine-imide hardener that is described below in FIG. 14. After forming, the liquid dielectric material is sprayed onto semiconductor device 12 such that a dielectric layer 58 is formed having a thickness greater than that of first passivation layer 22, with the thickness of dielectric layer 58 being determined and controlled based on the dielectric breakdown strength needed for semiconductor device 12. As set forth above, the thickness of dielectric layer 58 will be in the range of around 10-50 microns for every 1 kV of dielectric breakdown strength needed. Depending on the desired thickness and geometry of the dielectric layer 58, multiple spray coating steps may need to be performed.

Figure 6A:
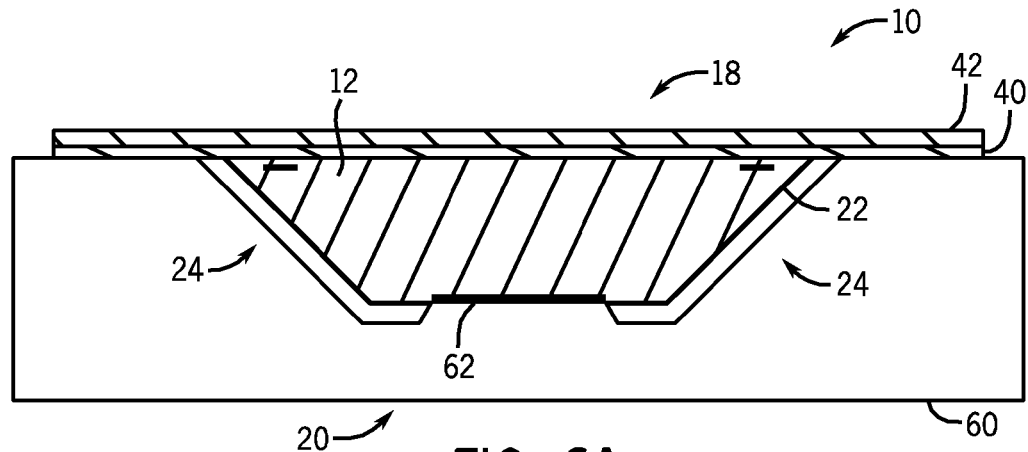
Figure 6B:
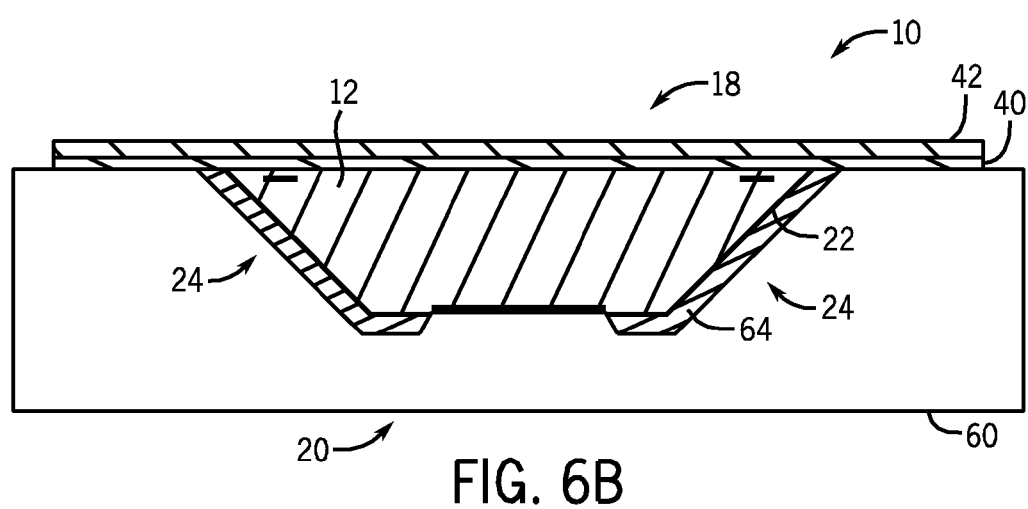
Figure 6C:
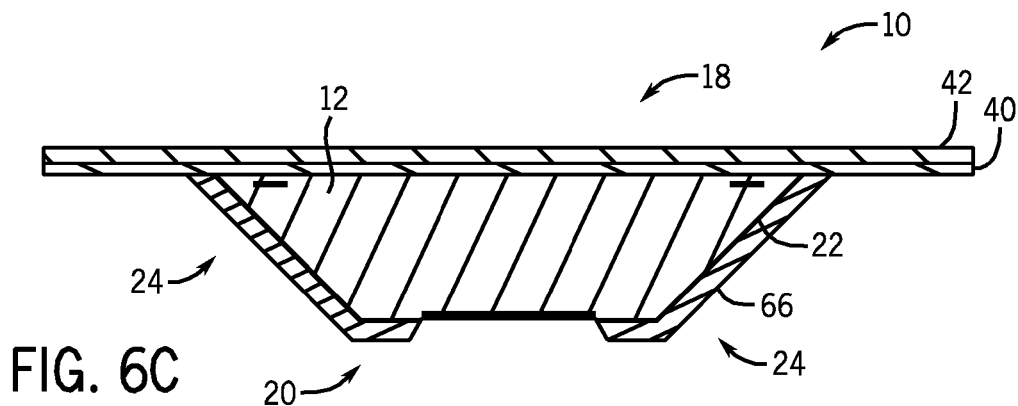

Referring now to FIGS. 6A-6C, according to another embodiment of the invention, a liquid dielectric material is applied over surface 20 and edges 24 of semiconductor device 12 using a mold to control a shape and thickness of a resulting dielectric layer. As shown in FIG. 6A, semiconductor device 12 and dielectric layer 42 are flipped over such that semiconductor device 12 is pointed downward. The semiconductor device 12 is then placed into a mold 60 positioned therebelow, with the semiconductor device 12 being held in place within mold 60 by, for example, a protrusion 62 formed in the center of mold 60, and such that a space is formed between the semiconductor device 12 and the mold 60. Exact positioning of the semiconductor device 12 within mold 60 may be provided by a pin align mechanism (not shown), for example. In a next step, and as shown in FIG. 6B, the mold 60 is filled with a liquid dielectric material 64, such as an epoxy or polyimide that is formed according to embodiments of the invention and described below with respect to FIG. 14, with the liquid being injected through a fill port (not shown) provided in the mold and into the space between the semiconductor device 12 and the mold 60. A vent port (not shown) is also provided in the mold to enable injection of the dielectric material 64. Upon filling of the mold 60 with the liquid dielectric material 64, the dielectric is cured and the mold removed, as shown in FIG. 6C, to form a finished dielectric layer 66 over the surface 20 and edges 24 of semiconductor device 12. As mold 60 is constructed of Teflon® or a similar material, the dielectric layer 64 should not stick to the mold 60 when removing semiconductor device 12 therefrom.

Figure 7:
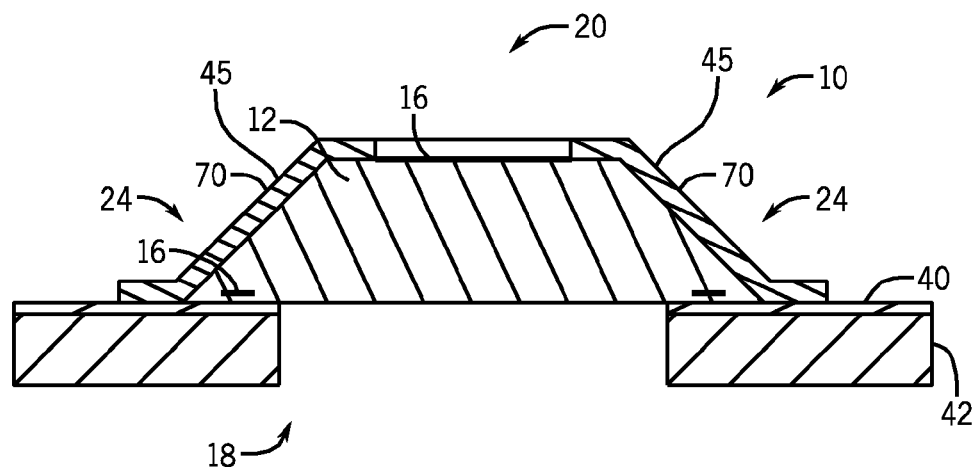

Referring now to FIG. 7, according to still another embodiment of the invention, a liquid dielectric material 45 is applied over surface 20 and edges 24 of semiconductor device 12 by way of a selective deposition process, or a "direct write" process. In direct writing of the dielectric material 45 onto the semiconductor device 12, dielectric material 45 is dispensed using a programmable dispensing tool (not shown) that deposits lines or dots 70 of the dielectric material in liquid form. For example, the programmable dispensing tool may be in the form of an inkjet printing-type device that selectively deposits lines or dots 70 of dielectric material 45 in liquid form. The lines/dots 70 are drawn to obtain the necessary coverage of the semiconductor device 12 and can be applied in multiple layers to obtain the necessary geometry and thickness for the dielectric material. The applied lines/dots 70 of dielectric material are then cured to complete the passivation.

Figure 8:
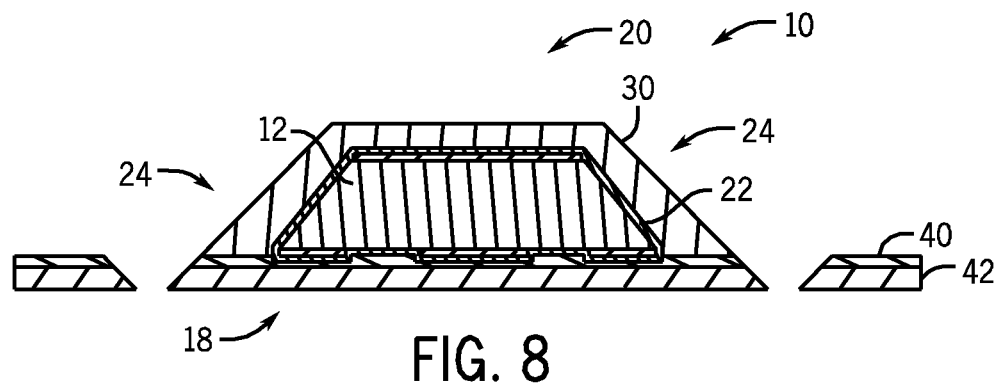

Referring now to FIG. 8, upon application of the second dielectric or passivation layer (generally designated henceforth as 30) over surface 20 and edges 24 of semiconductor device 12 via one of the techniques shown and described in the embodiments of FIGS. 4-7, the build-up process of semiconductor device package 10 may continue with an ablation of the second passivation layer 30. That is, it is recognized that in some cases the exact desired geometry/thickness of the second passivation layer 30 may not be obtained and slight modifications to the profile may need to be performed. One method that is used is laser ablation, or a similar method, to ablate away excess material to obtain the necessary profile of the passivation layer 30. As such, among the many beneficial properties derived from formulation of an epoxy/encapsulant according to the invention, as will be further described below, it is desirable that passivation layer 30 be ablatable with a laser. A typical laser for ablating includes a coherent light beam having a 350 nm wavelength. Thus, according to the invention and as will be described, an epoxy/encapsulant for passivation layers described herein, in this case second passivation layer 30, is formulated that includes a targeted sensitivity to laser ablation at particularly 350 nm. That is, in the above chip assemblies described, where a high dielectric strength material is desired and where laser ablation may be performed to form a via, embodiments of the invention may be used such that the material has a specific sensitivity for ablation at 350 nm. As shown in FIG. 8, the passivation layer 30 is shown as having a trapezoidal shape so as to match the trapezoidal shape of semiconductor device 12; however, it is recognized that other shapes and configurations for both passivation layer 30 and semiconductor device 12 are envisioned, such as a rectangular shape, for example. The modification of the thickness and/or geometry of second passivation layer 30 using laser ablation or another method can be performed for any of the dielectric material application methods set forth above, including the laminate application (FIGS. 4A-4C), spray coating application (FIG. 5), molding application (FIGS. 6A-6C), or direct writing application (FIG. 7). Thus, any of the dielectric materials discussed above may be prepared according to embodiments of the invention, and in particular for applications where it is desirable to laser ablate excess material. If, however, the desired geometry of the second passivation layer 30 is obtained upon an initial application of the dielectric material onto semiconductor device 12, such as may be envisioned especially using the molding application or direct writing application, it is recognized that ablating of the second passivation layer 30 to alter the thickness and geometry thereof may be forgone.

As further shown in FIG. 8, the semiconductor device 12 is "trimmed" such that a portion of any dielectric laminations (and accompanying adhesive layers) extending out past a desired profile of second passivation layer 30 along edges 24 of the semiconductor device 12 is removed. According to that shown in FIG. 8, a portion of base dielectric lamination 42 and adhesive layer 40 are trimmed from semiconductor device 12, such as by way of a laser ablation, for example, and using a dielectric material as described according to embodiments of the invention. It is recognized, however, that additional dielectric laminations extending out past a desired profile of second passivation layer 30 along edges 24 of the semiconductor device 12 could also be trimmed, such as dielectric lamination 52 (and adhesive layer 56) shown in FIG. 4C, for example. Similar to the removal of any excess material from the dielectric material formed about surface 20 and edges 24 of semiconductor device 12, the trimming of any dielectric laminations 42 extending out past a desired profile of second passivation layer 30 along edges 24 of the semiconductor device 12 may be performed so as achieve a desired shape of the remaining portion of dielectric layer 42 attached to semiconductor device 12. Thus, in the embodiment of FIG. 8, the trimming of semiconductor device 12 out from base dielectric lamination 42 is performed at an angle so as to maintain an overall trapezoidal shape of the second passivation layer 30 about semiconductor device 12.

Figure 9:
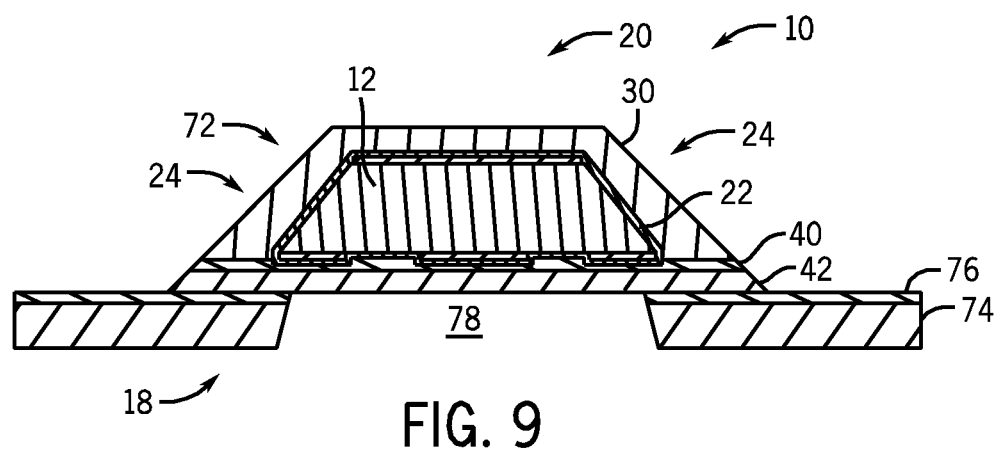
Figure 10:
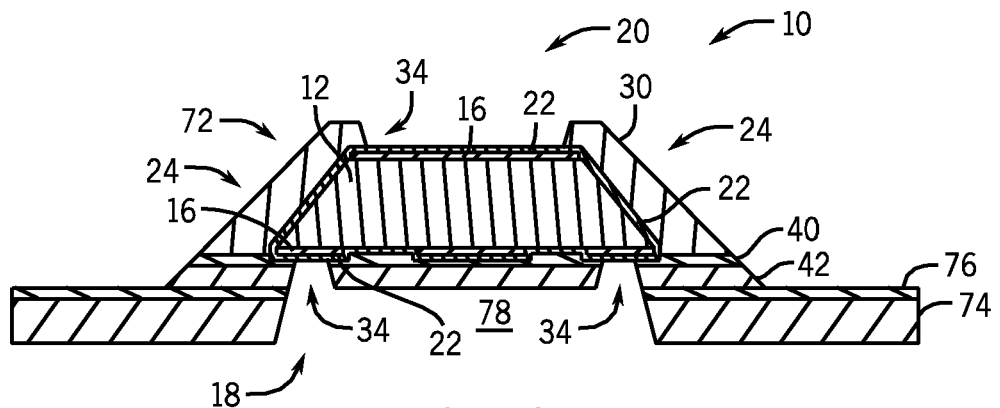

Referring now to FIG. 9, upon shaping of second passivation layer 30 and trimming of the semiconductor device 12 out from base dielectric layer 42, a passivated semiconductor device 72 is thus formed. The passivated semiconductor device 72 is subsequently attached to a dielectric sheet (e.g., polyimide sheet) 74 via an adhesive layer 76. As shown in FIG. 9, dielectric sheet 74 includes a window 78 opening pre-cut therein that generally corresponds in size to semiconductor device 12. It is recognized, however, that dielectric sheet 74 could also be in the form of a continuous sheet (i.e., no window pre-cut therein), and that a window could subsequently be formed therein after placement of passivated semiconductor device 72 on the dielectric sheet 74.

Upon securing passivated semiconductor device 72 to dielectric sheet 74, the build-up process of semiconductor device package 10 continues with the patterning and interconnection steps illustrated in FIGS. 10-13. With regard to these build-up steps, it is recognized that the technique used to apply second passivation layer 30 over surface 20 and edges 24 of semiconductor device 12 will determine the exact steps required regarding patterning the passivation layer 30 and making electrical interconnections to the top and bottom of the semiconductor device 12. Such variations in the exact build-up process steps employed in the patterning and interconnecting steps are addressed below Referring to FIG. 10, vias and contact areas (i.e., openings) 34 are formed in first and second passivation layers 22, 30 so as to provide access to circuits/connection pads 16 of semiconductor device 12. The vias/openings 34 are formed at positions corresponding to circuits/connection pads 16 on semiconductor device 12, with the vias/openings 34 being formed down to the first passivation layer 22 formed over those circuits/connection pads 16. According to embodiments of the invention, the vias/openings 34 may be formed by way of a laser ablation or laser drilling process, plasma etching, photo-definition, or mechanical drilling processes. In an embodiment of the invention where second passivation layer 30 is applied in the form of one or more dielectric laminations/sheets, such as sheets 44, 52 shown in FIGS. 4A-4C, vias/openings 34 may be mechanically drilled through the dielectric layer(s) and adhesive layer(s) applied over semiconductor device 12. In an embodiment of the invention where the second passivation layer 30 is applied via spray coating, direct writing, or molding, such as in FIGS. 5-7, vias/openings 34 may be formed in the passivation layer 30 in the regions that require interconnection to the device 12 using a laser ablation or laser drilling, and using a dielectric material that includes a composition and method of preparation according to embodiments of the invention. It is recognized, however, that certain methods of applying second passivation layer 30 may negate the need for subsequent ablating or drilling of vias/opening 34 therein. For example, for application of dielectric material employing a mold or direct writing technique, one or more vias/openings 34 may already be formed in second passivation layer 30.

Figure 11:
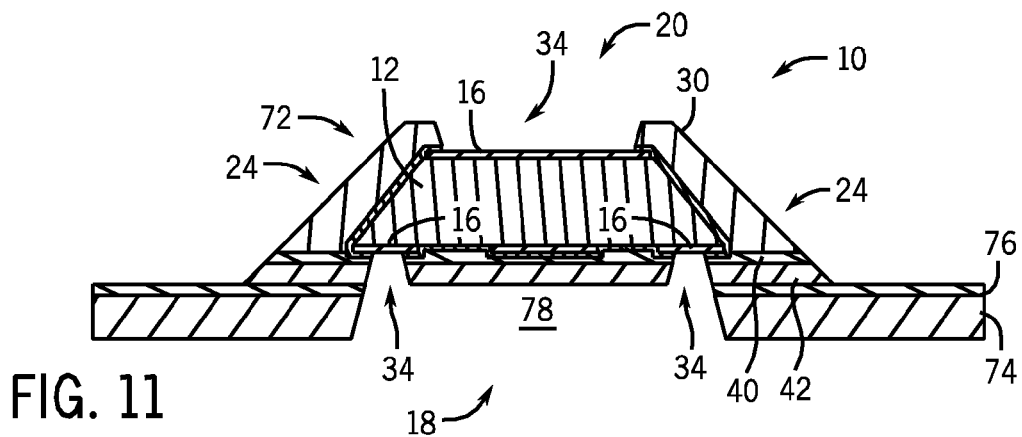

In a next step of the patterning/interconnect process, and as shown in FIG. 11, the vias/opening 34 are further extended down to the circuits/connection pads 16 on semiconductor device 12 by removing the first passivation layer 22 that is present over the circuits/connection pads 16 at the locations corresponding to vias/opening 34. First passivation layer 22 adjacent metal circuits and connection pads 16 of semiconductor device 12 may be removed by way of a reactive ion etching (RIE) process, although it is envisioned that other suitable techniques may also be employed. Upon extending of vias/opening 34 by way of removing of first passivation layer 22, the circuits/connection pads 16 of semiconductor device 12 are exposed so as to provide for an electrical interconnection to be made to those circuits/connection pads.

Upon completion of the formation of vias/opening 34 down to circuits/connection pads 16, the vias/opening 34 are cleaned (such as through an RIE desoot process) and subsequently metalized to form interconnects 36, as shown in FIG.

Figure 12:
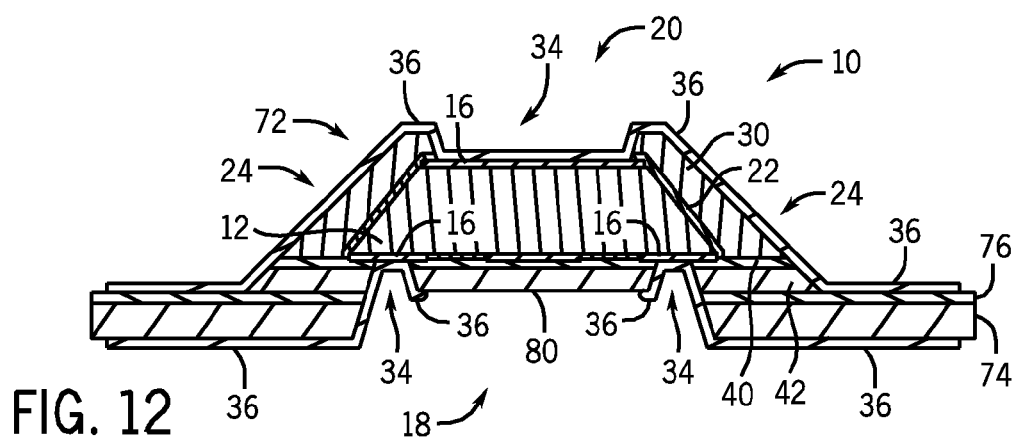

12. The metal interconnects 36 are typically formed through a combination of sputtering and electroplating applications. For example, a titanium adhesion layer and copper seed layer may first be applied via a sputtering process, followed by an electroplating process that increases a thickness of the copper to a desired level. The applied metal material is then subsequently patterned into metal interconnects 36 having a desired shape. As shown in FIG. 12, metal interconnects 36 form direct metallic and electrical connections to circuits/ connection pads 16 on semiconductor device 12. The metal interconnects 36 extend out from circuits and/or connection pads 16 of semiconductor device 12, through vias/opening 34, and out across opposing surfaces 18, of semiconductor device 12. The metal interconnects 36 further extend out past the edges 24 of semiconductor device 12 on opposing surfaces of dielectric sheet 74, such as in the form of copper plating on the dielectric sheet 74.

Figure 13:
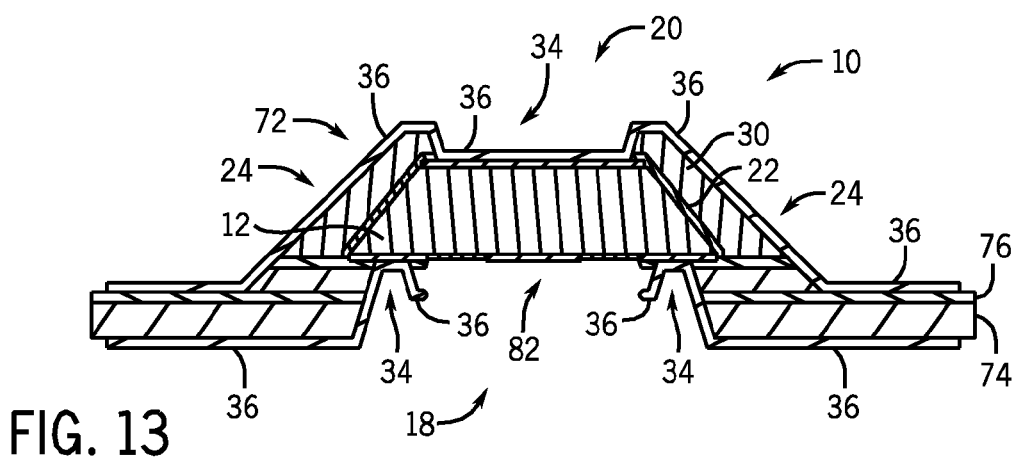

According to an embodiment of the invention where semiconductor device 12 is in the form of an optical diode (i.e., diode with light-based switching), a further patterning step is performed to remove an additional portion 80 of base dielectric layer 42. As shown in FIG. 13, portion 80 of base dielectric sheet 42 and adhesive layer 40 are ablated off of surface 18 of passivated semiconductor device 72, with a metal circuit/contact 16 serving as a backstop or mask for the ablating. An open window 82 is thus formed on surface 18 of passivated semiconductor device 72 that allows light to reach the optical diode 12. In such an embodiment, it is recognized that first passivation layer 22 would be composed of an optically clear and anti-reflective material that permits light to pass there through, while still offering protection of optical window 82 of the semiconductor device package 10.

Described throughout the aforementioned figures, including the semiconductor device package of FIG. 1 and the various stages of manufacturing and build-up of the device in FIGS. 2-13, a dielectric layer or passivation layer is provided that includes a composition according to an embodiment of the invention, and a method of forming the composition according to another embodiment of the invention.

Thus, an adhesive having the following beneficial properties is disclosed, according to an embodiment of the invention:

low viscosity to enable filling tight tolerances in a mold and also to allow spin coating onto a dielectric film for the method when it is used as a lamination adhesive;

ability to "partial cure" the adhesive when spun coated onto a film for lamination and thus control its flow properties during lamination and thereby achieve the desired dielectric thicknesses on a chip perimeter;

low surface tension to help void free encapsulation—both molding and lamination, where "wetting" the surface helps eliminate voids and provides a smoother spin coated films for lamination (no pullback, fish-eyes—this is also useful when the material is used as an underfill for components mounted on dielectric films (chip on flex), or where an ability to wet (underfill) and cure with low stress allows components on flex to be encapsulated without voids and warpage);

low stress (i.e., minimal shrinkage on cure and low storage modulus) to prevent warpage of a large chip—useful for molding, lamination, underfill, and the like;

reasonable (>1 hour) working pot life once the resin and hardener are mixed to allow degassing and application into the mold and/or spin coating on a film and subsequent lamination;

ability to substantially cure (or gel) at room or low temperature (<60° C.) (this enables void free molding and/or lamination because higher temperatures increase vapor pressures of the adhesive components which can cause voids, and once a "substantial" cure is complete, high temperature can be applied to complete the cure without concern for void formation and/or additional flow out);

sufficient absorption at ~350 nm to allow laser ablation of material from selected areas of the chip;

a glass transition temperature ($T_g$) high enough to prevent swelling and/or liquefying of the epoxy during ablation; and dielectric properties to withstand a high voltage operating environment needed for high frequency/low loss operation.

Low molecular weight, amine terminated polyimide oligomers are synthesized, degassed and added to cycloaliphatic amine compounds to obtain a liquid amine curing agent with specific amine equivalent weight, according to the invention. This material, when combined with a liquid epoxy resin, forms a low viscosity solution useful for chip encapsulation, lamination adhesive, and the like. This blend will gel within a few hours at room temperature and completely cure upon exposure to heat. The disclosed polyimide content epoxy blend increases the material's absorption at 350 nm, allowing clean laser ablation patterning with an laser having a 350 nm wavelength.

The amine hardener is a blend of trioxdiamine, diaminodicyclohexylmethane, toluene diamine and bisphenol-A dianhydride. It is made by adding the dianhydride into an excess of the diamine blend, and heating to remove water of imidization. The final product contains low molecular weight (MW) amine terminated imide oligomers and some free diamines. This provides a hardener that is strongly absorbing due to the imide linkages present, but still has a viscosity low enough to be mixed with an epoxy resin at room temperature. The imide oligomers also improve the thermal and electrical properties of the final cured blend as well as reduce shrinkage on cure.

The epoxy resin used with the amine hardener is, according to one embodiment, a diepoxy such as liquid cycloaliphatic. In one embodiment the cycloaliphatic is Araldite® CY184 (Araldite is a registered trademark of Huntsman Advanced Materials of Switzerland), optionally combined with bisphenol-A and bisphenol-F resins. Such products are typically distilled prior to use to ensure high purity (low halogen content) and because they are glycidyl epoxies, all react well with amine hardeners.

Also included during the final mixing of the epoxy encapsulant is a small amount of Zonyl® FSN-100 nonionic fluorosurfactant (Zonyl is a registered trademark of Du Pont, a Delaware Corporation). This material lowers surface tension at interfaces between the epoxy blend and substrate, providing better wetting and smoother coatings.

Figure 14:
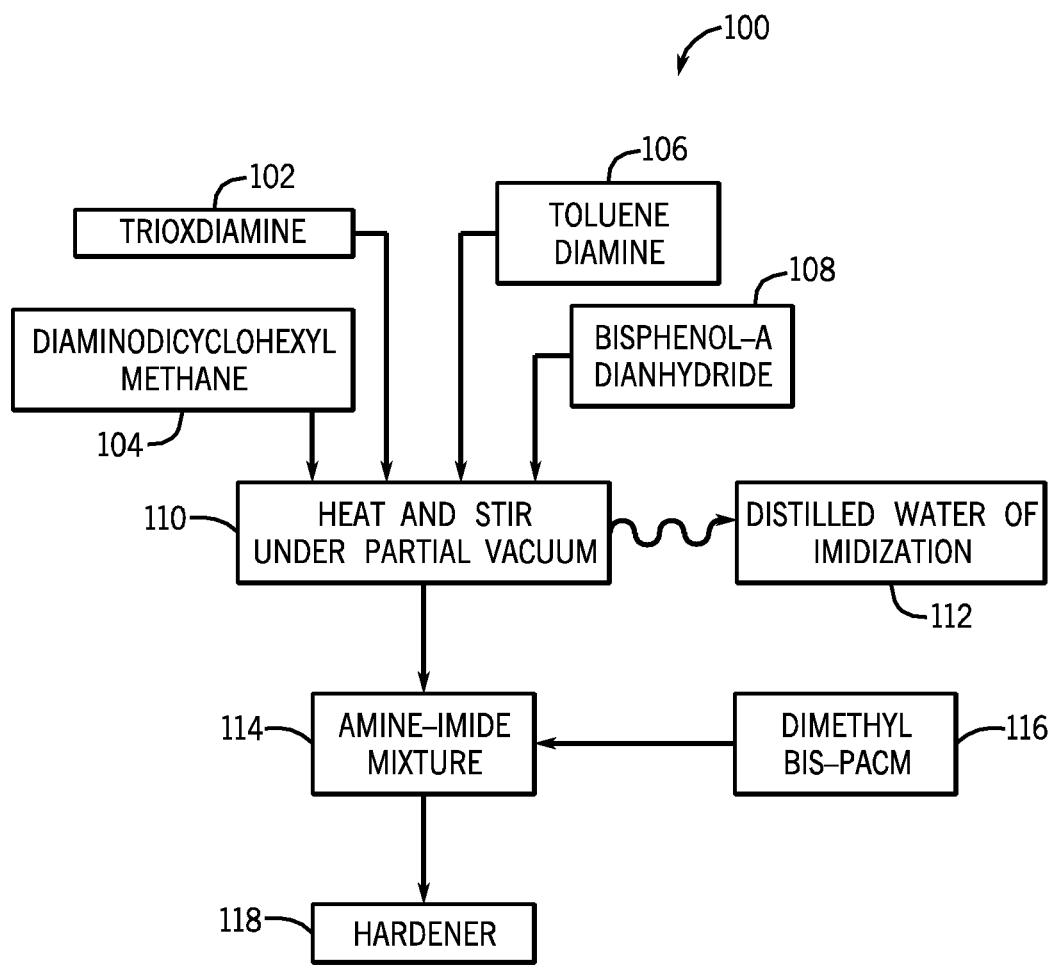
FIG. 14 is a flowchart illustrating a method of preparing an adhesive/encapsulant according to an embodiment of the invention.

Technique 100 below describe how this adhesive is made according to an embodiment of the invention, referring to FIG. 14:

Into a round bottom reaction flask is added the following reactants:

80 grams—4,7,10-Trioxatridecane-1,13-diamine (also referred to as trioxdiamine, MW=220 grams/mole) (step 102);

80 grams—Bis (p-aminocyclohexyl) methane (also referred to as diaminodicyclohexylmethane or bis-PACM, MW=210 grams/mole) (step 104);

1.0 gram—2,4-Diaminotoluene (also referred to as toluene diamine or TDI, MW=122 grams/mol) (step 106); and 32 grams—4,4-bisphenol-A dianhydride (also referred to as bisphenol-A dianhydride or BPADA, MW=520 grams/mole) (step 108).

At step 110 The mixture is heated under a partial vacuum (−50 torr) with stirring to enable condensation imidization reaction of the anhydride groups with amine resulting in the formation of water. During the course of approximately 1 hour of heating, the water of imidization is distilled 112 from the reactants along with some of the diamine reactants at a temperature ranging from approximately 160° C. to 190° C. About 66 grams of distillate is obtained, consisting of 2.2 grams water and 32 grams each of tri-oxdiamine and bis-PACM. This distillate mixture is discarded, resulting in an amine-imide mixture 114.

Into the amine-imide mixture is added the following material:
- 20 gr—3,3'-Dimethyl-4,4'diamino-dicyclohexylmethane (also referred to as dimethyl bis-PACM, MW=238 grams/mole) (step 116).

Figure 15:
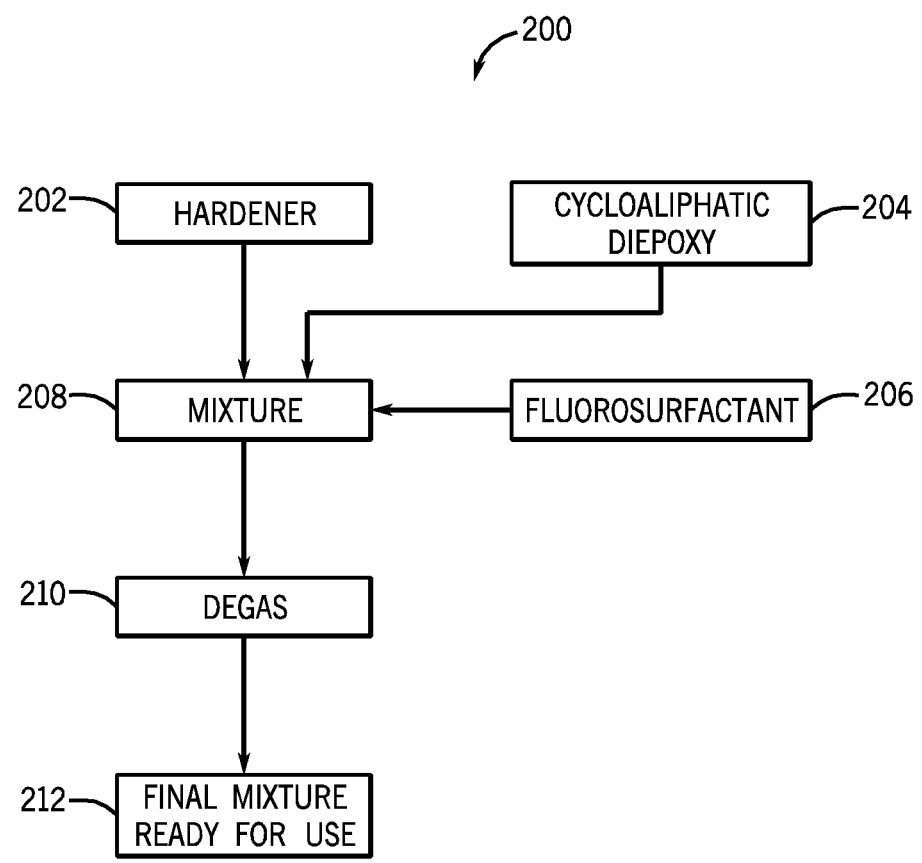
FIG. 15 is a flowchart illustrating a method of preparing an epoxy adhesive and/or molding encapsulant.

After blending, the amine hardener mixture is complete 118 and results in a transparent, yellow colored liquid having a viscosity of about 10,000 centipoise at room temperature. Referring to FIG. 15, an epoxy adhesive and/or molding encapsulant is prepared 200 with this amine mixture using the following formulation:
- 2.2 grams—amine/imide hardener (prepared as described above and completed at step 118) (step 202);
- 5.0 grams—Diglycidyl 1,2-cyclohexanedicarboxylate (also referred to as a cycloaliphatic diepoxy, MW=284 grams/mole) (step 204); and
- 0.02 gram Zonyl® FSN-100 fluorosurfactant. Zonyl® FSN-100 is a water-soluble, ethoxylated nonionic flurosurfactant that contains no solvent. (step 206)

The above materials are mixed or blended 208 together in a small mixing container, poured into a dispense tube and degassed 210 for about 30 minutes under vacuum at 40° C. The resultant blend, when cooled to room temperature, has a viscosity of about 2500 centipoise and is stable for about 1 hour for use 212 before it slowly begins increasing viscosity due to cure. Final cure of the epoxy blend is generally accomplished with a 15 hour room temperature cure followed by heating to 180° C. over 2 hours and dwelling at temperature for 30 minutes. Cured epoxy has a glass transition temperature ($T_g$) of 80° C. measured by a differential scanning calorimetry.

The composition can be modified for increased glass transition temperature (Tg) (adding more 4,4-bisphenol-A dianhydride and/or Bis (p-aminocyclohexyl) methane)), increased absorbance (adding more diaminotoluene), lower viscosity (increased 4,7,10-Trioxatridecane-1,13-diamine) and quicker cure by adding accelerators such as tris(dimethylaminomethyl) phenol. Also, the epoxy portion can be modified by replacing part or all of the liquid epoxy resin with resins or combinations of resins such as bisphenol-A diepoxy, bisphenol-F diepoxy, epoxy novolacs, glycidyl ether diepoxies and others. As known in the art, bisphenol and novolac epoxy resins are not cycloaliphatic, but aromatic containing resins, and glycidyl ether resins are aliphatic and are not cyclo aliphatic. The object is to obtain a liquid epoxy blend which can be used as both an encapsulant, underfill and adhesive which, upon mixing and cure provides all the requirement listed above.

According to one embodiment of the invention, an adhesive includes an epoxy resin and a hardener. The hardener includes trioxdiamine, diaminodicyclohexylmethane, toluene diamine, and bisphenol-A dianhydride.

According to another embodiment of the invention, a method of preparing an adhesive includes mixing together a plurality of reactants to form a hardener, the reactants comprising trioxdiamine, diaminodicyclohexylmethane, toluene diamine, and bisphenol-A dianhydride, mixing the hardener with an epoxy resin to form an uncured adhesive mixture, and curing the uncured adhesive mixture.

According to yet another embodiment of the invention, a method of forming a semiconductor device package includes positioning a semiconductor device against a material to form a space between a surface of the semiconductor device and the material, mixing together a plurality of reactants to form a hardener, the reactants comprising trioxdiamine, diaminodicyclohexylmethane, toluene diamine, and bisphenol-A dianhydride, mixing the hardener with an epoxy resin to form an uncured adhesive mixture, placing the uncured adhesive mixture into the space, and curing the uncured adhesive mixture.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An adhesive comprising:
    an epoxy resin; and
    a hardener comprising:
        trioxdiamine;
        diaminodicyclohexylmethane;
        toluene diamine; and
        bisphenol-A dianhydride.

2. The adhesive of claim 1 further comprising a water-soluble, ethoxylated surfactant.

3. The adhesive of claim 1 wherein the epoxy resin comprises a liquid diepoxy.

4. The adhesive of claim 3 wherein the liquid diepoxy comprises one of a cycloaliphatic epoxy, a bisphenol-A epoxy resin, a bisphenol-F epoxy resin, an epoxy novolac, and a glycidyl ether epoxy resin.

5. The adhesive of claim 1 comprising an accelerator comprising tris(dimethylaminomethyl) phenol.

6. A method of preparing an adhesive comprising:
    mixing together a plurality of reactants to form a hardener, the reactants comprising trioxdiamine, diaminodicyclohexylmethane, toluene diamine, and bisphenol-A dianhydride;
    mixing the hardener with an epoxy resin to form an uncured adhesive mixture; and
    curing the uncured adhesive mixture.

7. The method of claim 6 comprising mixing a water-soluble, ethoxylated surfactant with the uncured adhesive mixture.

8. The method of claim 6 wherein mixing together the plurality of reactants comprises mixing the trioxdiamine, the diaminodicyclohexylmethane, the toluene diamine, and the bisphenol-A dianhydride in approximate respective amounts, measured by mass, of 80:80:1:32.

9. The method of claim 6 comprising heating the hardener under partial vacuum prior to mixing the hardener with the epoxy resin.

10. The method of claim 6 wherein mixing together the plurality of reactants to form the hardener comprises first mixing together the trioxdiamine, the diaminodicyclohexylmethane, and the toluene diamine to form a diamine blend, then adding the bisphenol-A dianhydride into an excess of the diamine blend.

11. The method of claim 10 comprising heating the hardener after the bisphenol-A dianhydride has been added into the excess of the diamine blend to remove water of imidization that results from adding the bisphenol-A dianhydride to the diamine blend.

12. The method of claim 11 wherein heating the hardener comprises heating the hardener to between 160° C. and 190° C.

13. The method of claim 6 wherein mixing the hardener with the epoxy resin comprises mixing the hardener with a liquid diepoxy.

14. The method of claim 13 comprising mixing the liquid diepoxy with one of a cycloaliphatic epoxy, bisphenol-A epoxy resin, a bisphenol-F epoxy resin, an epoxy novolac, and a glycidyl ether epoxy resin prior to mixing the hardener with the epoxy resin.

15. The method of claim 6 comprising adding an accelerator comprising tris(dimethylaminomethyl) phenol to the uncured adhesive mixture.

16. The method of claim 6 comprising ablating the adhesive after curing using a laser having approximately a 350 nm wavelength.

17. A method of forming a semiconductor device package comprising:
    positioning a semiconductor device against a material to form a space between a surface of the semiconductor device and the material;
    mixing together a plurality of reactants to form a hardener, the reactants comprising trioxdiamine, diaminodicyclohexylmethane, toluene diamine, and bisphenol-A dianhydride;
    mixing the hardener with an epoxy resin to form an uncured adhesive mixture;
    placing the uncured adhesive mixture into the space; and
    curing the uncured adhesive mixture.

18. The method of claim 17 wherein mixing the hardener with the epoxy resin comprises mixing the hardener with a liquid cycloaliphatic diepoxy.

19. The method of claim 17 comprising mixing a water-soluble, ethoxylated surfactant with the uncured adhesive mixture.

20. The method of claim 17 wherein mixing together the plurality of reactants comprises mixing the trioxdiamine, the diaminodicyclohexylmethane, the toluene diamine, and the bisphenol-A dianhydride in approximate respective amounts, measured by mass, of 80:80:1:32.

* * * * *